United States Patent
Tilke et al.

(10) Patent No.: US 7,679,130 B2
(45) Date of Patent: Mar. 16, 2010

(54) DEEP TRENCH ISOLATION STRUCTURES AND METHODS OF FORMATION THEREOF

(75) Inventors: Armin Tilke, Beacon, NY (US); Danny Pak-Chum Shum, Poughkeepsie, NY (US); Laura Pescini, Dresden (DE); Ronald Kakoschke, Munich (DE); Karl Robert Strenz, Dresden (DE); Martin Stiftinger, Stockdorf (DE)

(73) Assignee: Infineon Technologies AG, Munich (DE)

( * ) Notice: Subject to any disclaimer, the term of this patent is extended or adjusted under 35 U.S.C. 154(b) by 831 days.

(21) Appl. No.: 11/367,247

(22) Filed: Mar. 3, 2006

(65) Prior Publication Data
US 2006/0267134 A1    Nov. 30, 2006

Related U.S. Application Data

(60) Provisional application No. 60/679,334, filed on May 10, 2005.

(51) Int. Cl.
*H01L 27/115* (2006.01)

(52) U.S. Cl. .............. 257/316; 257/374; 257/376; 257/397; 257/398; 257/519; 257/520; 257/E27.067

(58) Field of Classification Search .......... 438/201, 438/211, 224, 257, 424, 435, 437; 257/316, 257/374, 376, 397, 398, 519, 520, E27.067
See application file for complete search history.

(56) References Cited

U.S. PATENT DOCUMENTS

| | | | |
|---|---|---|---|
| 4,549,927 A | 10/1985 | Goth et al. | |
| 4,692,992 A | 9/1987 | Hsu | |
| 4,835,115 A | 5/1989 | Eklund | |
| 4,994,406 A | 2/1991 | Vasquez et al. | |
| 5,296,392 A * | 3/1994 | Grula et al. | 438/222 |
| 5,306,940 A | 4/1994 | Yamazaki | |
| 5,313,419 A | 5/1994 | Chang | |
| 5,468,676 A | 11/1995 | Madan | |

(Continued)

FOREIGN PATENT DOCUMENTS

EP    0 810 667 A2    12/1997

(Continued)

OTHER PUBLICATIONS

Li, C.-N. B., et al., "A Novel Uniform-Channel-Program-Erase (UCPE) Flash EEPROM Using an Isolated P-well Structue," IEDM 00, Apr. 2000, pp. 779-782, IEEE, Los Alamitos, CA.

(Continued)

*Primary Examiner*—M. Wilczewski
*Assistant Examiner*—Toniae M Thomas
(74) *Attorney, Agent, or Firm*—Slater & Matsil, L.L.P.

(57) ABSTRACT

Deep trench isolation structures and methods of formation thereof are disclosed. Several methods of and structures for increasing the threshold voltage of a parasitic transistor formed proximate deep trench isolation structures are described, including implanting a channel stop region into the bottom surface of the deep trench isolation structures, partially filling a bottom portion of the deep trench isolation structures with an insulating material, and/or filling at least a portion of the deep trench isolation structures with a doped polysilicon material.

25 Claims, 9 Drawing Sheets

U.S. PATENT DOCUMENTS

| | | | |
|---|---|---|---|
| 5,471,422 A | 11/1995 | Chang et al. | |
| 5,635,415 A | 6/1997 | Hong | |
| 5,644,532 A | 7/1997 | Chang | |
| 5,702,988 A | 12/1997 | Liang | |
| 5,717,634 A | 2/1998 | Smayling et al. | |
| 6,037,222 A | 3/2000 | Huang et al. | |
| 6,096,597 A | 8/2000 | Tsu et al. | |
| 6,141,242 A | 10/2000 | Hsu et al. | |
| 6,146,970 A | 11/2000 | Witek et al. | |
| 6,180,456 B1 | 1/2001 | Lam et al. | |
| 6,184,107 B1 | 2/2001 | Divakaruni et al. | |
| 6,207,501 B1 | 3/2001 | Hsieh et al. | |
| 6,214,696 B1 | 4/2001 | Wu | |
| 6,228,712 B1 | 5/2001 | Kawai et al. | |
| 6,251,734 B1 | 6/2001 | Grivna et al. | |
| 6,258,667 B1 | 7/2001 | Huang | |
| 6,284,593 B1 | 9/2001 | Mandelman et al. | |
| 6,284,602 B1 | 9/2001 | He et al. | |
| 6,297,127 B1 | 10/2001 | Chen et al. | |
| 6,303,413 B1 * | 10/2001 | Kalnitsky et al. | 438/151 |
| 6,307,781 B1 | 10/2001 | Shum | |
| 6,327,182 B1 | 12/2001 | Shum et al. | |
| 6,368,907 B1 | 4/2002 | Doi et al. | |
| 6,406,960 B1 | 6/2002 | Hopper et al. | |
| 6,438,030 B1 | 8/2002 | Hu et al. | |
| 6,559,008 B2 | 5/2003 | Rabkin et al. | |
| 6,566,197 B2 | 5/2003 | Kwon et al. | |
| 6,600,199 B2 | 7/2003 | Voldman et al. | |
| 6,628,544 B2 | 9/2003 | Shum et al. | |
| 6,667,226 B2 | 12/2003 | Pinto et al. | |
| 6,693,830 B1 | 2/2004 | Hu et al. | |
| 6,806,540 B2 | 10/2004 | Watanabe et al. | |
| 6,815,311 B2 | 11/2004 | Hong et al. | |
| 6,841,824 B2 | 1/2005 | Shum | |
| 6,844,588 B2 | 1/2005 | Cavins et al. | |
| 6,864,151 B2 | 3/2005 | Yan et al. | |
| 6,864,530 B2 | 3/2005 | Yoon | |
| 6,885,080 B2 | 4/2005 | Chen et al. | |
| 6,909,139 B2 | 6/2005 | Shum et al. | |
| 2004/0183159 A1 | 9/2004 | Tamaki et al. | |
| 2005/0045944 A1 | 3/2005 | Gratz et al. | |
| 2005/0179111 A1 * | 8/2005 | Chao | 257/510 |
| 2006/0033145 A1 | 2/2006 | Kakoschke et al. | |

FOREIGN PATENT DOCUMENTS

| | | |
|---|---|---|
| EP | 0 926 728 A1 | 6/1999 |
| EP | 0 997 930 A1 | 5/2000 |
| EP | 1 209 749 A1 | 5/2002 |
| EP | 1 351 292 A2 | 10/2003 |
| JP | 02-260564 | 10/1990 |
| WO | WO 02/15190 A2 | 2/2002 |
| WO | WO 2004/023553 A2 | 3/2004 |

OTHER PUBLICATIONS

Yang, E. C.-S., et al., "Novel Bi-Directional Tunneling Program/Erase NOR (BiNOR)-Type Flash EEPROM," IEEE Transactions on Electron Devices, Jun. 1999, pp. 1294-1296, vol. 46, No. 6, IEEE, Los Alamitos, CA.

Chang, et al., "Fabrication Method of Shallow and Deep Trench Isolation Structure", Abstract of TW 594912 (B), Jun. 21, 2004, Application No. TW20020134134 20021122.

English translation of the Examination Notification Issued to Taiwan Patent Application No. 095115512, Jan. 9, 2009.

* cited by examiner

DEEP TRENCH ISOLATION STRUCTURES AND METHODS OF FORMATION THEREOF

This application claims the benefit of U.S. Provisional Application No. 60/679,334, filed on May 10, 2005, entitled, "Deep Trench Isolation Structures and Methods of Formation Thereof," which application is hereby incorporated herein by reference.

CROSS-REFERENCE TO RELATED APPLICATIONS

This application relates to the following issued and co-pending patent applications, which applications are hereby incorporated herein by reference:

| Ser. No. | U.S. Pat. No. | Filing date | Issue Date | Title |
| --- | --- | --- | --- | --- |
| 10/234,344 | 6,841,824 B2 | Sep. 4, 2002 | Jan. 11, 2005 | Flash Memory Cell and the Method of Making Separate Sidewall Oxidation |
| 10/607,610 | 6,909,139 B2 | Jun. 27, 2003 | Jun. 21, 2005 | One Transistor Flash Memory Cell |
| 10/615,630 | 6,864,151 B2 | Jul. 9, 2003 | Mar. 8, 2005 | Method of Forming Shallow Trench Isolation Using Deep Trench Isolation |
| 10/918,335 | — | Aug. 13, 2004 | — | Integrated Memory Device and Process |

TECHNICAL FIELD

The present invention relates generally to the fabrication of semiconductor devices, and more particularly to the formation of deep trench isolation structures for isolation of adjacent wells.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography to form circuit components and elements thereon, forming integrated circuits.

Some types of integrated circuits utilize deep trenches to isolate adjacent circuit components from one another. The deep trenches may be several micrometers (μm) deep, and are typically filled with an insulating material such as silicon dioxide ($SiO_2$) or other dielectric material, for example. The deep trenches may have a high aspect ratio, e.g., about 10:1 or greater, for example.

Flash memory cell structures in particular can benefit from deep trench isolation, for example. Flash memory cells are typically constructed in a triple well configuration, where the n-doped source and drain regions of the flash memory cells are located in a P well that is located above an N well in order to be isolated from the p-doped substrate below. Thus, the P wells of the flash memory cells are shortened in this configuration, and no independent voltages can be applied to the P wells of individual flash memory cells. The use of deep trench isolation makes the application of an independent voltage to the P wells of individual flash memory cells possible. In particular, the use of deep trench isolation in flash memory cell arrays allows the application of a voltage to a selected flash memory cell P well without disturbing the other flash memory cells, for example.

In some semiconductor designs, filling a deep trench completely with $SiO_2$ results in excessive stress to the semiconductor materials, resulting in decreased yields and device failures. Thus, to prevent these negative impacts of stress, in some designs, deep trench isolation structures are lined with an insulating material such as $SiO_2$, and are then filled with polysilicon. Because the substrate or semiconductor wafer the deep trench isolation structures are formed in also comprises silicon, the stress of the polysilicon and the substrate are similar, so that stress does not create a problem in the semiconductor device.

However, in some applications, a deep isolation trench filled with an insulating liner and a polysilicon fill can result in a parasitic transistor being formed. For example, if the substrate has a P well formed therein and an N well formed beneath the P well, and the deep trench extends into both the P well and the N well, a parasitic transistor is formed, with the P wells functioning as the source and drain, and with a conductive inversion channel being formed around the deep trench bottom in the N well.

Many integrated circuits include a plurality of transistors formed within and over a substrate, as well as other devices. The transistors and other devices may be separated by deep trench isolation structures, for example. If a parasitic transistor is formed within a deep trench isolation structure, the isolation properties of the deep trench isolation structure suffer.

Thus, what are needed in the art are improved methods of forming deep trench isolation structures and structures thereof.

SUMMARY OF THE INVENTION

These and other problems are generally solved or circumvented, and technical advantages are generally achieved, by preferred embodiments of the present invention, which provide novel methods of forming deep trench isolation structures. Deep trench isolation structures are formed by one or more methods, to be described further herein. Embodiments of the present invention include methods of fabricating deep trench isolation structures that are particularly beneficial when used in flash memory cell structures, for example.

In accordance with a preferred embodiment of the present invention, a semiconductor device includes a workpiece, at least two devices formed within the workpiece, and at least one deep trench isolation structure including a top portion and a bottom portion formed within the workpiece between the at least two devices. A parasitic transistor is formed in the workpiece proximate the at least one deep trench isolation structure, the parasitic transistor having a threshold voltage. A thin insulating liner lines the at least one deep trench isolation structure, and a semiconductive material fills at least the top portion of the at least one deep trench isolation structure within the thin insulating liner. The semiconductor device includes a means for increasing the threshold voltage of the parasitic transistor.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention.

It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely with respect to deep trench isolation structures for flash memory cells. Embodiments of the invention may also be applied, however, to other semiconductor device applications wherein deep trench isolation structures are utilized, such as in static or non-volatile memories, other memory devices, complementary metal oxide semiconductor (CMOS) devices, bi-CMOS devices, and other applications, as examples. The deep trench isolation structures may be used to isolate adjacent P wells from one another, for example.

Figure 1:
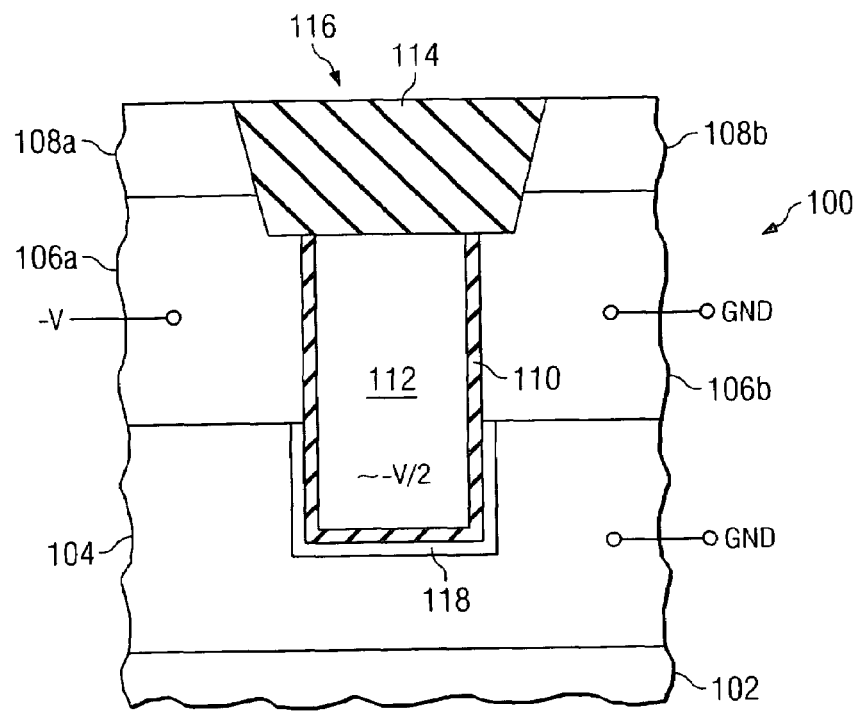
FIG. 1 shows a cross-sectional view of a less preferred embodiment of a deep trench isolation structure having a parasitic transistor with a low threshold voltage.

With reference now to FIG. 1, there is shown a less-preferred embodiment of the present invention, which includes a semiconductor device 100 having a deep trench isolation structure 116 in a cross-sectional view. The deep trench isolation structure 116 is formed in a workpiece 102 having a first well 106a/106b, and a second well 104 formed therein. The workpiece comprises a substrate 102 disposed below the second well 104. In a flash memory device, for example, the workpiece 102 may comprise a p type substrate comprising a third well, the second well 104 may comprise an N well, and the first well 106a/106b may comprise a P well. The first well 106a/106b and the second well 104 may each comprise a thickness of about 1 µm, for example. A source and drain region 108a/108b may be disposed in the region above the first well 106a/106b, having a thickness of about 100 nm or less, for example. The source and drain region 108a/108b may comprise areas where the source and drain of the flash memory cells are formed, for example (not shown). The deep trench isolation structure 116 isolates adjacent flash memory cells from one another.

The deep trench isolation structures 116 are filled with a thin insulating liner 110 that typically comprises about 40 nm of silicon dioxide, and a polysilicon fill material 112 disposed over the insulating liner 110. After the deep trench isolation structures 116 are filled with the liner 110 and the polysilicon material 112, a region of shallow trench isolation 114 is formed in a top portion of the deep trench isolation structure 116 as shown. The shallow trench isolation 114 is typically wider than the deep trench isolation structure 116; e.g., the deep trench isolation structure 116 may be about 3 µm or less in depth and about 0.25 µm or less in width, and the shallow trench isolation 114 may be about 0.4 µm in depth and about 0.4 µm or greater in width.

Flash memory cells store a charge in a floating gate (not shown in FIG. 1) and are 'programmed' e.g., using Fowler-Nordheim tunneling, although flash memory cells may alternatively be programmed using other methods, for example. The active areas of the flash memory cells comprise the P wells 106a/106b that are isolated from the substrate 102 by the buried N well 104; e.g., the deep trench isolation structure 116 isolates laterally from the adjacent P well. It would be desirable to fill the deep trench isolation structures 116 completely with insulating material; however, doing so would result in reduced yields because the stress, e.g., due to different thermal expansion coefficients of silicon dioxide and silicon, caused by the insulating fill material within the deep trench isolation structures 116, would create dislocations in the material. Furthermore, it is difficult to fill such high aspect ratio features with an oxide material. Thus, the thin insulating liner 110 is used and filled with polysilicon 112, in some deep trench isolation structure 116 designs, as shown in FIG. 1.

In flash memory devices, high voltages typically must be applied to the P well of the devices in operation, e.g., to read and/or write to the devices. If all of the P wells in a flash memory cell array are connected, then all of the flash memory cells in the array have the same bias applied to their P wells. This is not optimal in terms of device performance. However, if adjacent P wells are isolated from one other by a deep trench isolation structure, then the P wells of the individual flash memory cells can be biased independently.

However, one problem with the deep trench isolation structure 116 shown is that because the thin insulating liner 110 is thin, a parasitic transistor may be formed, e.g., by an inversion region 118 that is electrically created at the bottom of the trench within the N well 104, as shown in FIG. 1, which activates a parasitic field effect transistor (FET). The parasitic transistor is activated at relatively low voltages, e.g., at about 5 volts (V). For example, if a voltage is applied between the P wells 106a/106b without inducing a current flow, the polysilicon 112 in the deep trench 116 may also be biased, because there is a coupling between the polysilicon fill 112 and the adjacent P wells 106b/106a. A voltage –V applied to one side of the deep trench isolation structure 116 in the P well 106a creates a parasitic FET, with the polysilicon trench fill 112 acting as a gate electrode, for example, by current flowing from one P well to the adjacent P well on the other side of the trench 116. Because the polysilicon fill material 112 is conductive, a voltage of about or below –V/2 is created in the fill material 112.

In the past, for technologies having a larger minimum feature size, for example, a thicker oxide liner could be used to line a deep trench isolation structure 116, and the threshold voltage of the parasitic transistor was thus very high. However, as semiconductor devices are scaled down in size, the thin insulating liner 110 is very thin, e.g., 40 nm or less, and the threshold voltage of the parasitic transistor thus is on the order of only several volts. Because the N well is grounded, the negative potential creates an inversion 118 at the deep trench bottom in the N well 104, so that there is a current path from one P well 106a through the N well 104 to the other P well 106b, i.e., a source-channel-drain flow of current, driven by the gate (e.g., the polysilicon fill 112 functions as a gate of the parasitic transistor). The threshold voltage $V_t$ of the parasitic transistor in such a structure can be excessively low so that the deep trench isolation structure 116 fails to isolate adjacent devices. Thus, in some applications, P wells 106a and 106b cannot be effectively isolated using such a deep trench isolation structure 116.

Embodiments of the present invention achieve technical advantages by increasing the threshold voltage $V_t$ of parasitic transistors formed in deep trench isolation structures. Several means and methods of increasing the threshold voltage of a parasitic transistor formed proximate deep trench isolation structures will be described herein. Implanting a channel stop region into the bottom surface of the deep trench isolation structures, partially filling a bottom portion of the deep trench isolation structures with an insulating material, and/or depositing a polysilicon fill material containing a high content of dopants into the deep trench isolation structures will be described. The various methods and structures of increasing the threshold voltage of the parasitic transistor to be described herein may be used alone, or may be used in combinations thereof, for example.

Figure 2:
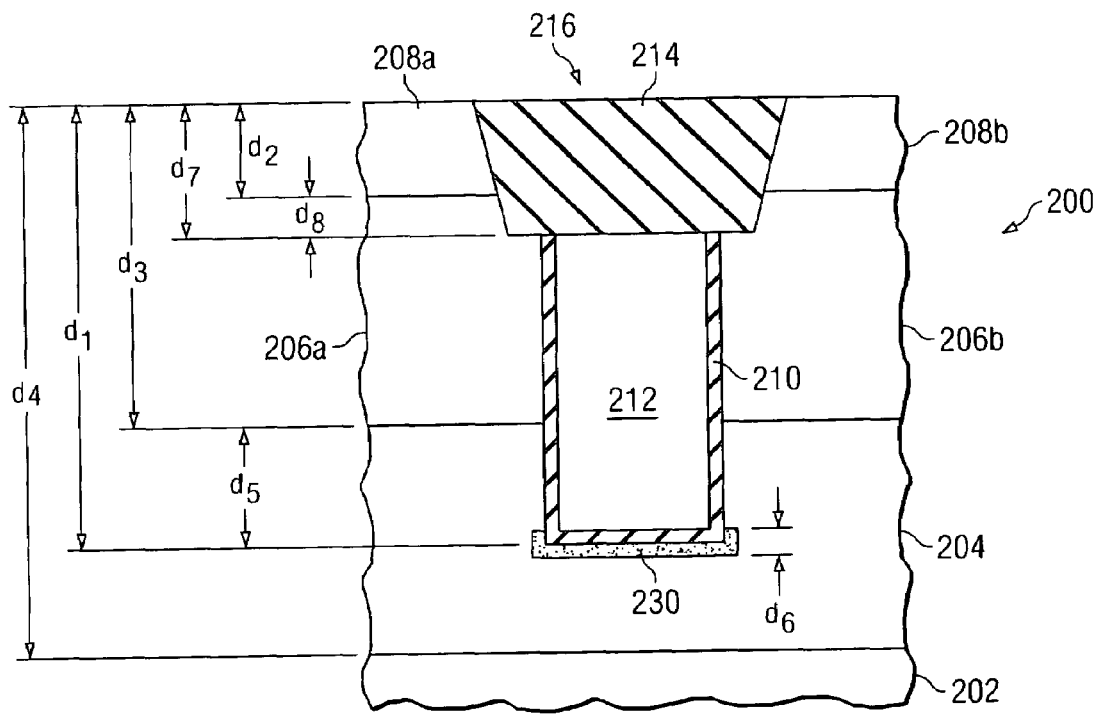
FIG. 2 is a cross-sectional view of a deep trench isolation structure in accordance with an embodiment of the present invention, wherein a channel stop region is implanted into the bottom surface of the deep trench isolation structure.

Referring to FIG. 2, which shows a cross-sectional view of a semiconductor device 200, preferably, in accordance with embodiments of the present invention, the semiconductor device 200 includes a workpiece 202 and at least two devices formed within the workpiece. Like numerals are used for the reference numbers in FIG. 2 as were used in FIG. 1. A portion 208a and 208b of the at least two devices are shown in FIG. 2, wherein the portions 208a and 208b represent a source and drain region of a flash memory cell, as an example. The semiconductor device 200 includes at least one deep trench isolation structure 216 including a top portion and a bottom portion formed within the workpiece 202 between the at least two devices. A parasitic transistor (e.g., from region 206a to 204 to 206b) is formed in the workpiece proximate the at least one deep trench isolation structure 216, the parasitic transistor having a threshold voltage. A thin insulating liner 210 is formed lining the at least one deep trench isolation structure 216, and a semiconductive material 212 fills at least the top portion of the at least one deep trench isolation structure 216 within the thin insulating liner 210. For example, in the embodiment shown in FIG. 2, the semiconductive material 212 completely fills the deep trench 216 beneath the shallow trench isolation region 214. Embodiments of the present invention include novel means for increasing the threshold voltage of the parasitic transistor proximate the at least one deep trench isolation structure 216.

A trench for the deep trench isolation structure 216 is formed within the workpiece 202 having a depth $d_1$. Depth $d_1$ preferably comprises about 3 μm or less, as an example, and may alternatively comprise other dimensions, for example. The deep trench isolation structure 216 may have a high aspect ratio, e.g., about 10:1 or greater in one embodiment, and may comprise a width of about 0.25 μm or less, as examples. The workpiece 202 includes a first well 206a/206b and a second well 204 disposed beneath the first well 206a/206b, in one embodiment. The first well 206a/206b may be formed by implanting the workpiece 202 with a first dopant between a depth $d_2$ and a depth $d_3$, and the second well 204 may be formed by implanting the workpiece 202 with a second dopant between a depth $d_3$ and depth $d_4$, as shown. Depth $d_2$ may comprise about 300 nm, depth $d_3$ may comprise about 1.5 μm, and depth $d_4$ may comprise about 2.5 μm, as examples, although depths $d_2$, $d_3$, and $d_4$ may alternatively comprise other dimensions. Preferably, the deep trench isolation structure 216 is formed so that it extends into the second well 204 by a depth $d_5$, as shown, wherein depth $d_5$ preferably comprises about 0.5 μm or less, although alternatively, depth $d_5$ may comprise other dimensions.

The first well 206a/206b is preferably doped with one or more types of p type dopants to form a P well within the workpiece 202, and the second well 204 is preferably doped with one or more types of n type dopants to form an N well within the workpiece 202, for example. The workpiece 202 is preferably lightly doped with p type dopants in this embodiment and may comprise a third well, for example. However, the first well 206a/206b may alternatively be doped with n type dopants to form an N well within the workpiece 202, and the second well 204 may alternatively be doped with p type dopants to form a P well within the workpiece 202 (not shown). The workpiece 202 may be lightly doped with n type dopants in this embodiment and may comprise a third well, for example. The deep trench isolation structure 216 preferably extends through the first well 206a/206b and at least partially through the second well 204 formed in the workpiece 202, as shown.

In the first embodiment shown in FIG. 2, the means for increasing the threshold voltage of the parasitic transistor includes a channel stop region 230 formed just below the bottom surface of a deep trench isolation structure 216. The channel stop region 230 is preferably formed in one embodiment by implanting a dopant into the bottom surface of the deep trench isolation structure 216. The dopant implanted into the second well 204 at the bottom of the deep trench isolation structure 216 to form the channel stop region 230 preferably comprises the same dopant implanted into the second well 204, or another dopant of the same type, for example, at a higher concentration than the dopant concentration of the second well 204, for example. The concentration of the dopant in the channel stop region 230 is preferably in the order of about 10 to 100 times greater than the concentration of dopant in the second well 204, for example.

The implantation process to form the channel stop region 230 may be performed after the deep trench isolation structure 216 is etched (e.g., after a trench is formed) into the workpiece 202, or after the formation of the thin insulating liner 210. For example, the channel stop region 230 may be formed by implanting the dopant into the second well 204 region through the thin insulating liner 210, in one embodiment. The channel stop region 230 is preferably implanted after the deep trench isolation structure 216 is etched and before the wells 206a/206b and 204 are implanted, in accordance with one embodiment of the present invention, so that the P well 206a/206b and N well 204 do not exist yet when the channel stop region 230 implantation takes place, for example.

Advantageously, the channel stop region 230 suppresses the electrical formation of a parasitic transistor, by increasing the threshold voltage required for a parasitic transistor effect to take place during the operation of the semiconductor device 200. The threshold voltage $V_t$ is locally increased and thus also allows isolation with only a thin deep trench liner 210, in this embodiment.

The depth $d_6$ of the implantation process is preferably about 20 to 80 nm, as examples, although alternatively, depth $d_6$ may comprise other dimensions. If the second well 204 comprises an N well, for example, the second well 204 may have a dopant concentration of about $1 \times 10^{17}$ cm$^{-3}$, and the channel stop region 230 may comprise a dopant concentration of about $1 \times 10^{19}$ cm$^{-3}$, although alternatively, the second well 204 and the channel stop region 230 may comprise other dopant concentrations, for example. Portions of the top surface of the workpiece 202, e.g., source and drain region 208, may be masked using a photoresist or hard mask during the dopant implantation process, not shown.

After the thin insulating liner 210 is formed, and after the channel stop region 230 is formed (e.g., either before or after the thin insulating liner 210 is formed), the deep trench isolation structure 216 is filled with a semiconductive material 212 such as undoped polysilicon, e.g., by chemical vapor deposition (CVD), and a shallow trench isolation region 214 is formed at the top region of the deep trench isolation structure 216, as shown in FIG. 2. The shallow trench isolation 214 may comprise a depth $d_7$ of about 400 nm, as an example, and preferably extends within the first well 206a/206b by a depth $d_8$ of about 100 to 300 nm, also as an example, although alternatively, depths $d_7$ and $d_8$ may comprise other dimensions. The shallow trench isolation 214 is formed by etching a trench using lithography and filling the trench with an insulating material, such as an oxide (e.g., SiO$_2$), for example.

Figure 3:
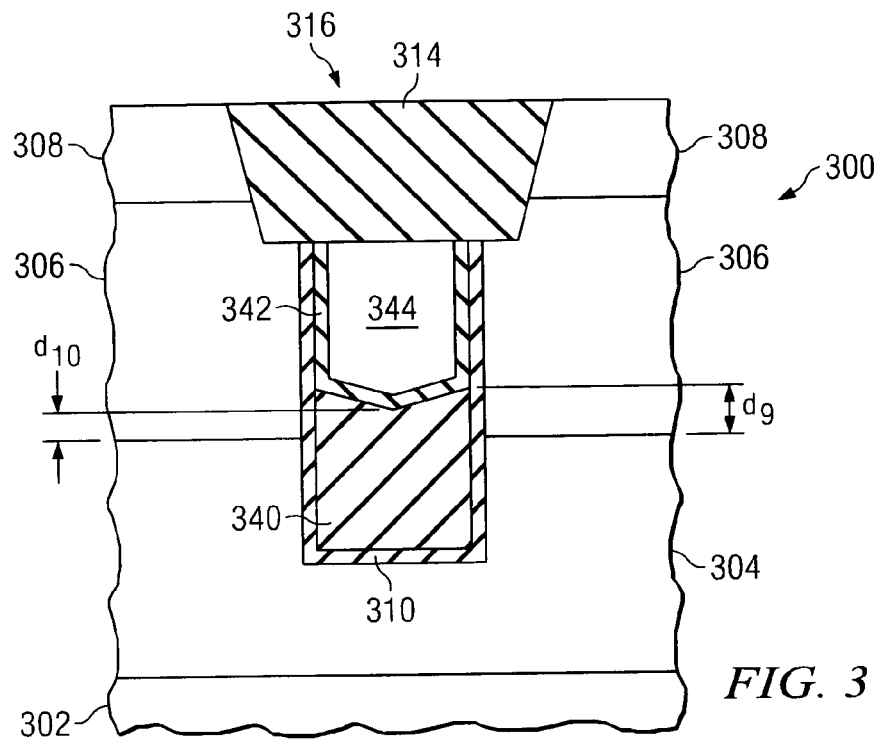
FIG. 3 is a cross-sectional view of a deep trench isolation structure in accordance with another embodiment of the present invention, wherein an insulating material is disposed within a bottom portion of the deep trench isolation structure.

FIG. 3 is a cross-sectional view of a deep trench isolation structure 316 in accordance with a second preferred embodiment of the present invention, wherein the means for increasing the threshold voltage of the parasitic transistor includes an insulating material 340 disposed within a bottom portion of the deep trench isolation structure 316 over the thin insulating liner 310. Again, like numerals are used for the reference numbers in FIG. 3 as were previously used with reference to FIGS. 1 and 2.

Figure 4:
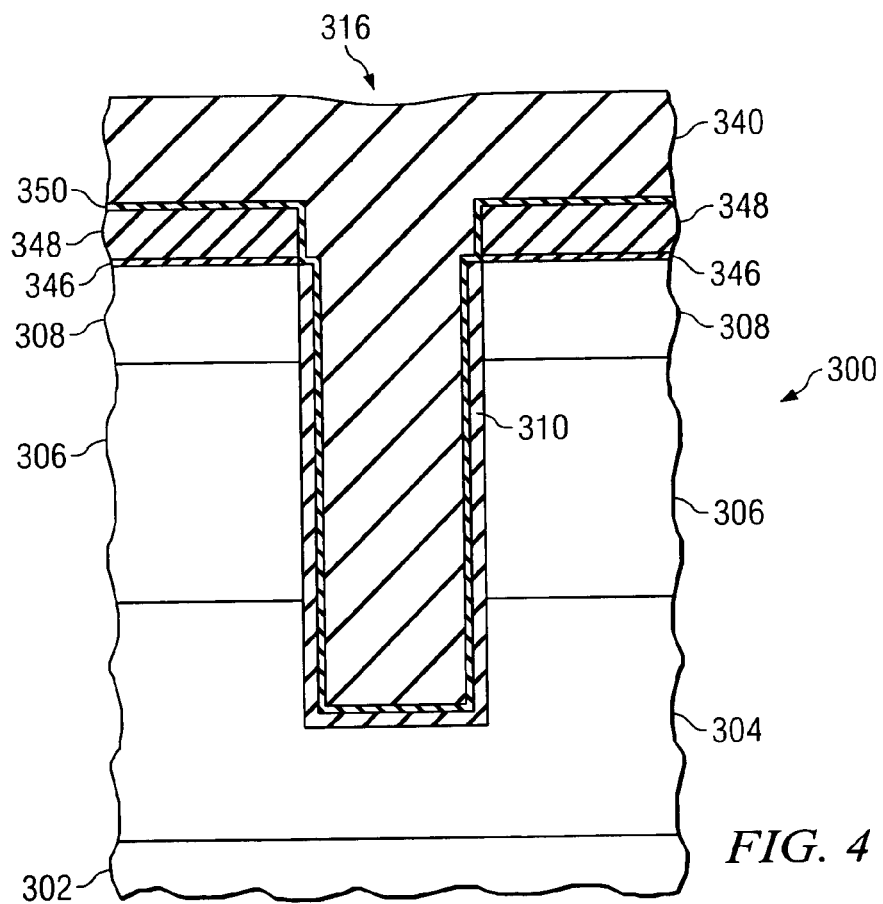
FIGS. 4 through 6 show a method of forming the insulating material of FIG. 3 within the bottom portion of the deep trench isolation structure at various stages of manufacturing.
Figure 5:
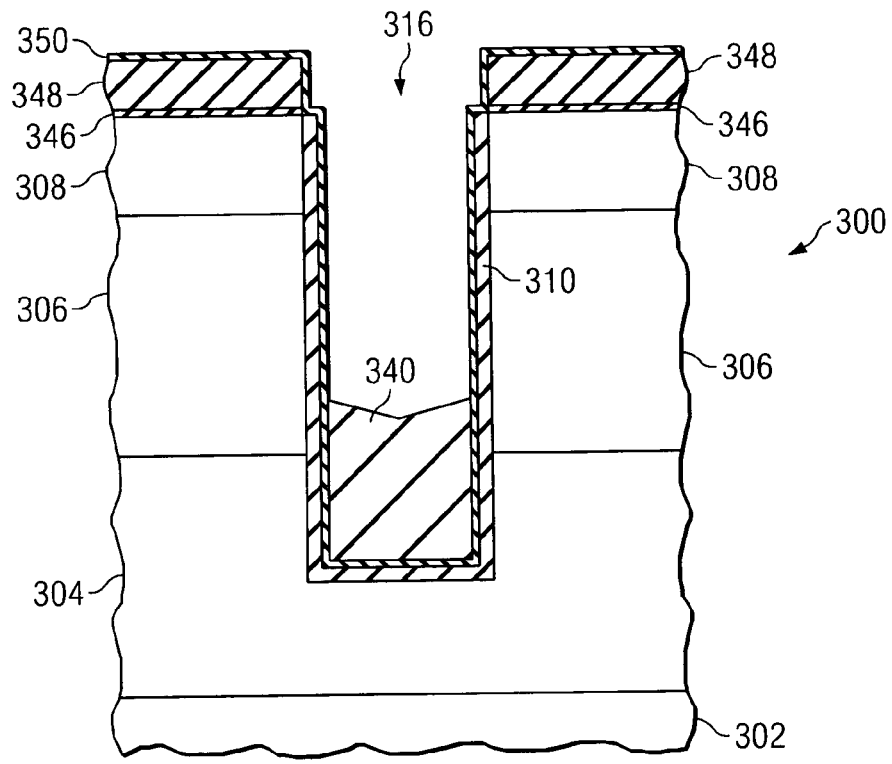
Figure 6:
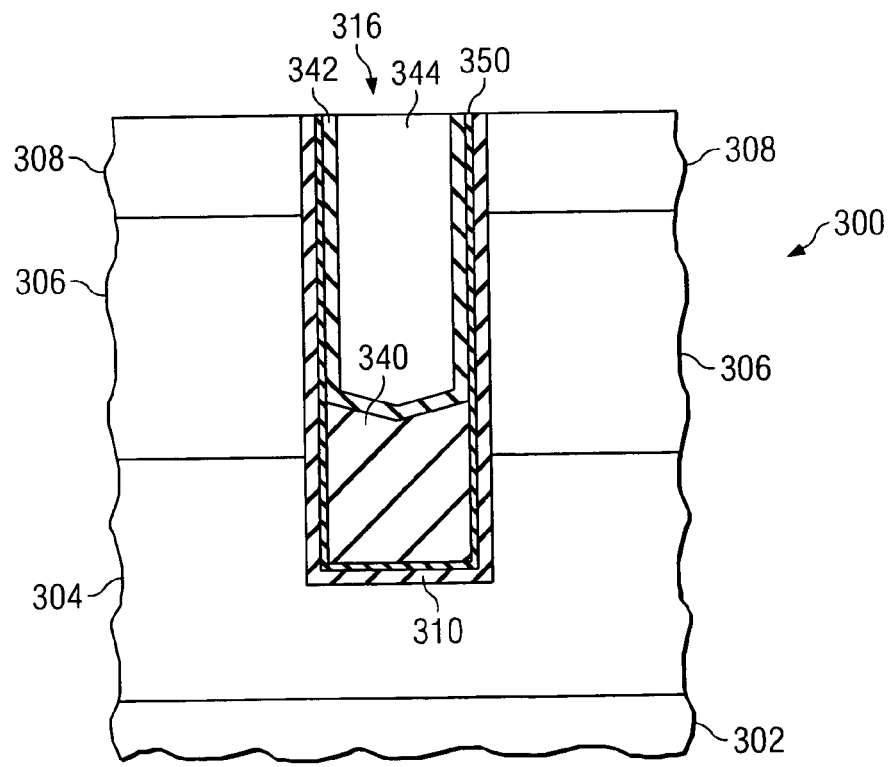

FIGS. 4 through 6 show a first method of forming the insulating material 340 within the bottom portion of the deep trench isolation structure 316 at various stages of manufacturing in accordance with an embodiment of the invention, in cross-sectional views. In this method, a blanket oxide 340 is deposited over the top surface of the workpiece 302, which at least partially fills the deep trench isolation structures 316, as shown. The blanket oxide 340 may comprise tetra ethyl oxysilane, (TEOS) deposited by CVD, for example, although alternatively, the oxide 340 may comprise other insulators formed using other methods.

Before depositing the oxide 340, an optional etch stop layer 350, comprising a nitride, for example, may be deposited over the thin insulating layer 310, as shown. Optional material layers 346 and 348, comprising pad oxides and/or pad nitrides, for example, may be formed on the top surface of the workpiece 302, as shown, e.g., before the formation of the deep trench isolation structure 316, to protect the source and drain regions 308 from the reactive ion etch (RIE) process or other etch process used to pattern the deep trench isolation structure 316, for example.

The blanket oxide 340 is etched back, e.g., using a timed etch and HF acid. The optional etch stop layer 350 may function as an etch stop for the etch-back of the blanket oxide 340, in this embodiment, for example. Preferably, a portion of the oxide, e.g., about 50 nm or greater, is left remaining above the interface of the second well 304 and the first well 306, as shown in FIG. 5 and also in FIG. 3 at $d_9$ and $d_{10}$. The insulating material 340 may comprise a slightly greater thickness $d_9$ in the corners of the deep trench 316 than at the center, e.g. at $d_{10}$, for example.

A semiconductive material 344 comprising undoped polysilicon, for example, is deposited over the insulating material 340. The optional material layers 346 and 348 are stripped or removed after the shallow trench isolation 314 is formed, leaving the semiconductor device 300 similar to the structure shown in FIG. 3.

Note that an optional additional thin oxide layer 342 may be formed over the insulating material 340 in the bottom of the deep trench isolation structure 316 and over the sidewalls of the top portion of the deep trench isolation structure 316 before forming the semiconductive material 344 within the top portion of the deep trench isolation structure 316, as shown in FIG. 6. The thin oxide layer 342 preferably comprises a layer of silicon dioxide having a thickness of about 20 nm that is formed only over the sidewalls of the deep trench isolation structure 316 and over the top surface of the insulating material 340, as shown.

Figure 7:
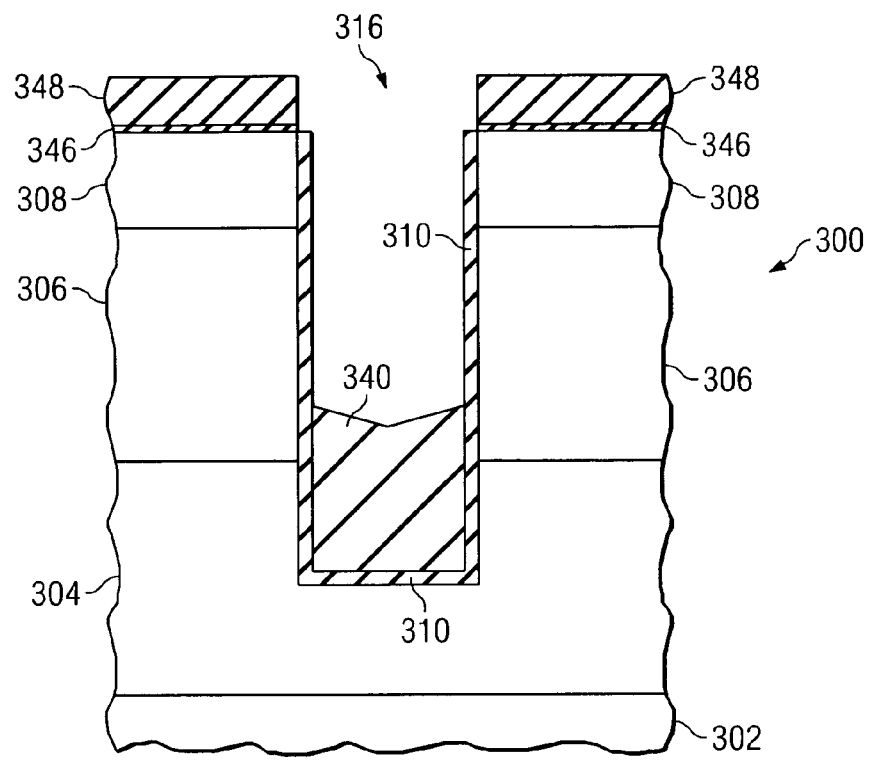
FIGS. 7 and 8 show another method of forming the insulating material of FIG. 3 within the bottom portion of the deep trench isolation structure at various stages of manufacturing.
Figure 8:
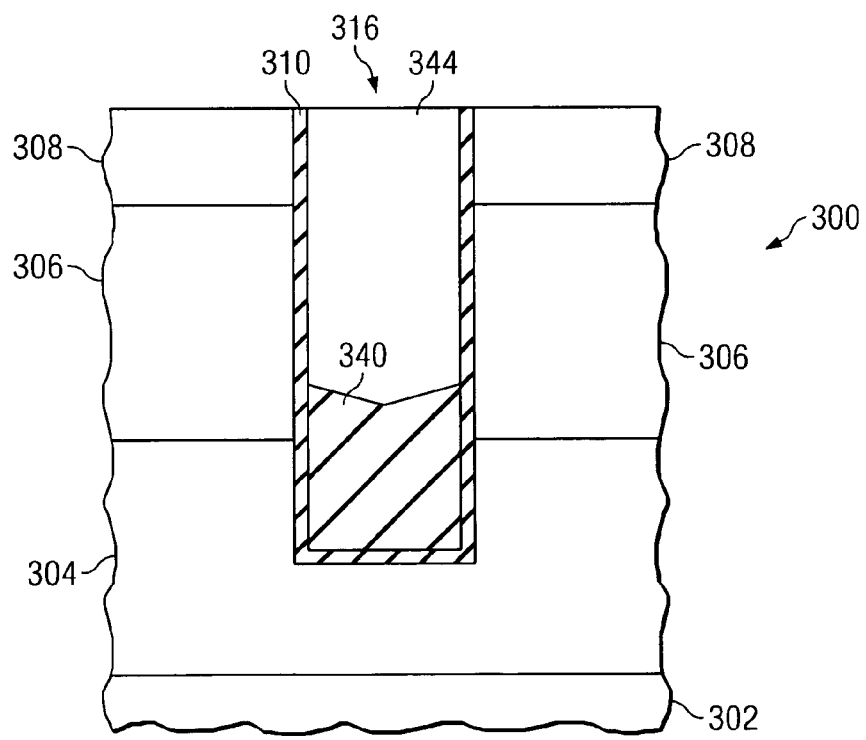

FIGS. 7 and 8 show another method of forming the insulating material of FIG. 3 within the bottom portion of the deep trench isolation structure 316 at various stages of manufacturing. In this embodiment, preferably a bottom up fill process is used to form the insulating material 340 within the bottom of the deep trench isolation structure 316. For example, an insulating material 340 may be deposited using a process such as a flowable oxide (e.g., FlowFill by Trikon) or other spin-on-glass materials, as examples, wherein the insulating material 340 may be used to partially fill the deep trench isolation structure 316, e.g., to fill the bottom portion of the deep trench isolation structure 316 with an insulating material 340 comprising silicon dioxide, as shown in FIG. 7, stopping at a height slightly above the second well 304, as shown. The semiconductive material 344, preferably comprising polysilicon, is then deposited over the top surface of the insulating material 340, as shown in FIG. 8, in order to completely fill the deep trench isolation structure 316. Again, an optional additional oxide liner 342 may be formed before filling the deep trench isolation structure 316 with the semiconductive material 344, as shown in FIG. 3. The optional material layers 346 and 348, if present, are stripped or removed after the shallow trench isolation 314 is formed, leaving the semiconductor device 300 similar to the structure shown in FIG. 3.

Because in this embodiment, the semiconductive material 344 does not extend into the second well 304, the threshold voltage of a parasitic transistor proximate the deep trench isolation structure 316 is increased, for example.

Figure 9:
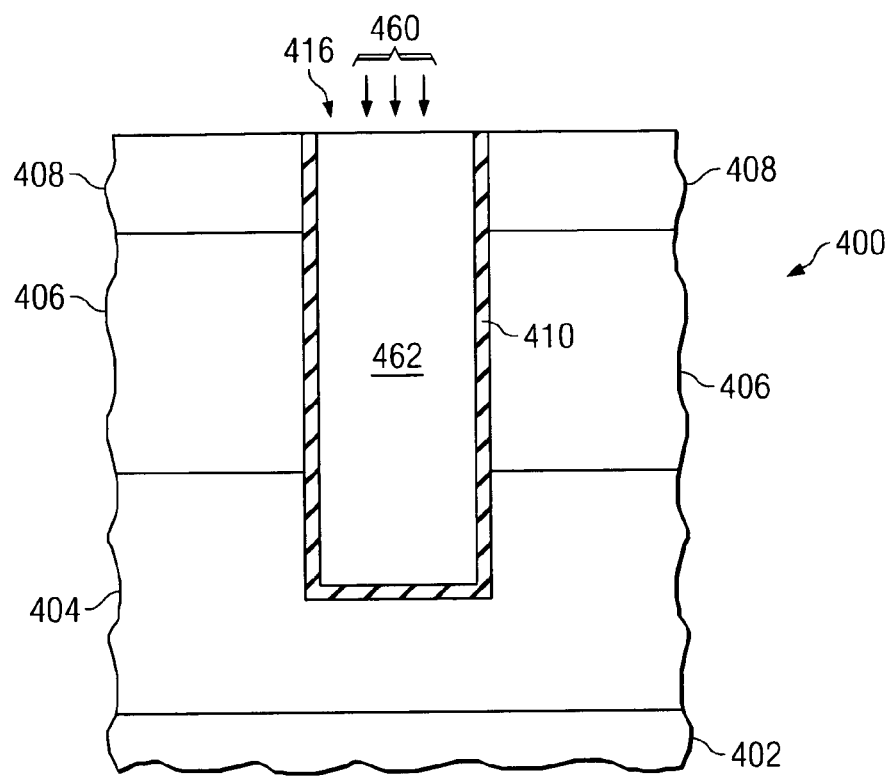
FIG. 9 is a cross-sectional view of another embodiment of the present invention, wherein a semiconductive fill material within a deep trench isolation structure is deposited containing a dopant.

FIG. 9 is a cross-sectional view of a third embodiment of the present invention, wherein a semiconductive fill material 462 within a deep trench isolation structure 416 is highly doped with a dopant 460, preferably in-situ during the deposition, for example, in accordance with one embodiment of the present invention. Again, like numerals are used for the reference numbers in FIG. 9 as were used in the other figures herein.

In this embodiment, the semiconductive fill material 462 may comprise undoped polysilicon, for example, that is deposited using low pressure CVD (LPCVD). In a preferred embodiment, a dopant gas may be added to the silane or other chemical used for the polysilicon deposition, for example. A chemical-mechanical polish (CMP) process may be used to remove excess semiconductive fill material from over the top surface of the source and drain region 408. Alternatively, the semiconductive material may be deposited, and then implanted with a dopant 460, as shown, to form the doped semiconductive material 462. Portions of the top surface of the workpiece 402, e.g., source and drain regions 408, may be masked using a photoresist or hard mask during the dopant implantation process, not shown.

The semiconductive material 462 is preferably doped with the same dopant or same dopant type that is implanted into the second well 404, for example, in one embodiment. The concentration of the dopant in the semiconductive material 462 is preferably in the order of about 1,000 to 10,000 times greater than the concentration of dopant in the second well 404, for example. If the second well 404 comprises an N well, for example, the second well 404 may have a dopant concentration of about $1 \times 10^{17}$ cm$^{-3}$, and the concentration of the dopant in the semiconductive material 462 may comprise a dopant concentration of about $1 \times 10^{20}$ cm$^{-3}$, although alternatively, the second well 404 and the semiconductive material 462 may comprise other dopant concentrations, for example.

The doped semiconductive material 462 advantageously increases the voltage at which the first wells 406 and second well 404 proximate the deep trench isolation structure 416 electrically function as a parasitic transistor, thus effectively increasing the threshold voltage of the parasitic transistor of the structure. The semiconductive material 462 within the deep trench isolation structure 416 acts as a highly doped fill to increase the threshold voltage, for example. Doping the polysilicon fill material, e.g., semiconductive material 462, changes the work function of the polysilicon fill material 462, compared to an undoped fill material. Therefore, a higher voltage is necessary to turn on the parasitic transistor of the structure.

Figure 10:
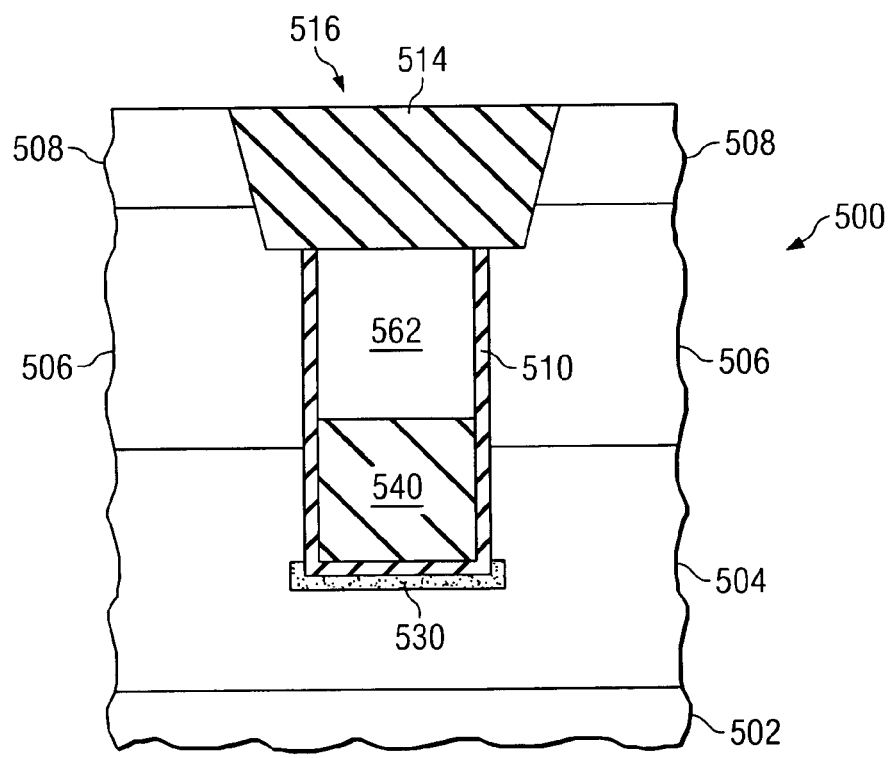
FIG. 10 illustrates a combination of embodiments of the present invention implemented in a deep trench isolation structure.

The three embodiments of the present invention described herein may be used alone or in combinations. For example, FIG. 10 illustrates a combination of all three embodiments of the present invention described herein implemented in a deep trench isolation structure 516. Again, like numerals are used for the reference numbers in FIG. 10 as were used in the other figures herein. Note that any one of the embodiments may be omitted, leaving the other two in the structure. For example, the channel stop region 530 may be omitted, leaving the partial fill of the deep trench isolation structure 516 bottom portion with the insulating material 540 and also including a highly doped semiconductive material 562 formed at a top portion of the deep trench isolation structure 516.

Figure 11A:
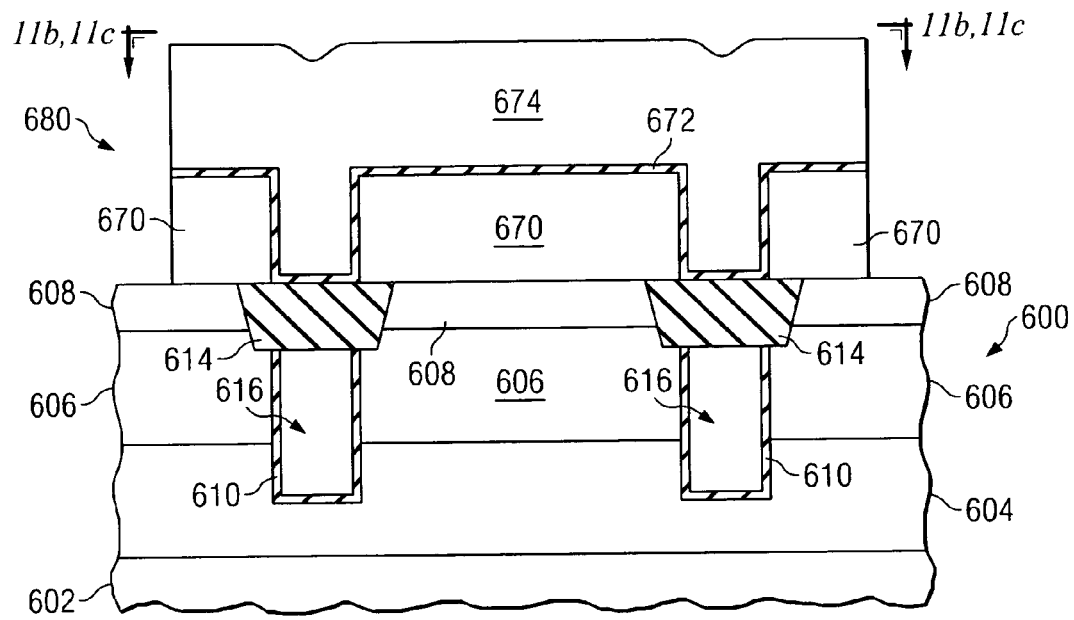
FIGS. 11a, 11b, and 11c show cross-sectional views (FIG. 11a) and top views (FIGS. 11b and 11c) of the novel deep trench isolation structures described herein implemented in a flash memory cell design.
Figure 11B:
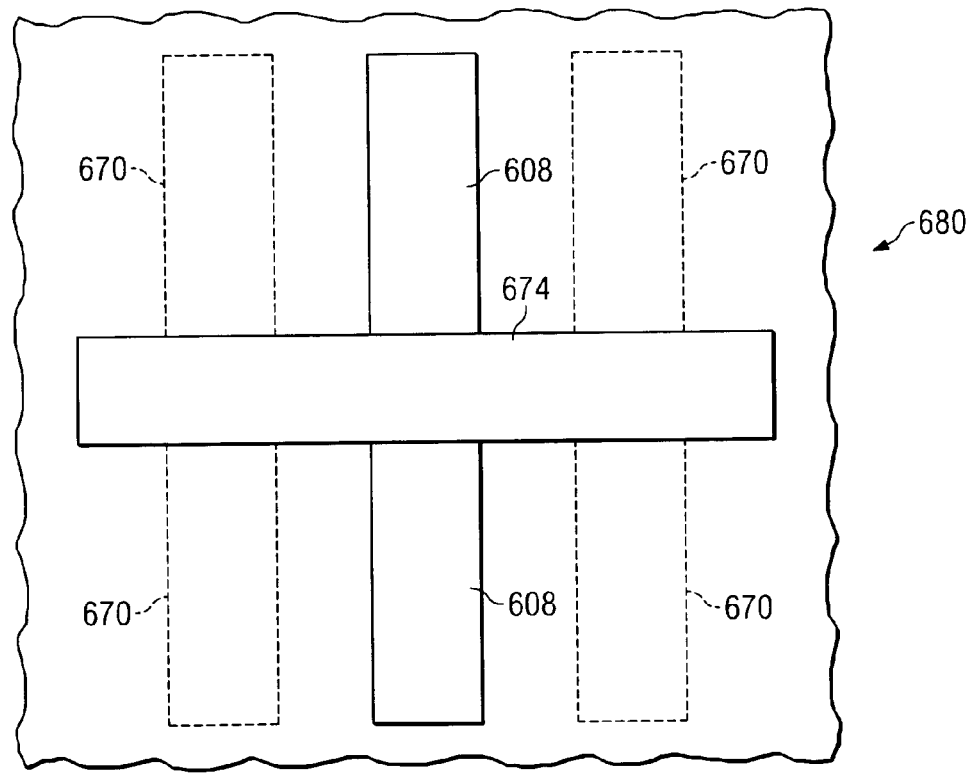
Figure 11C:
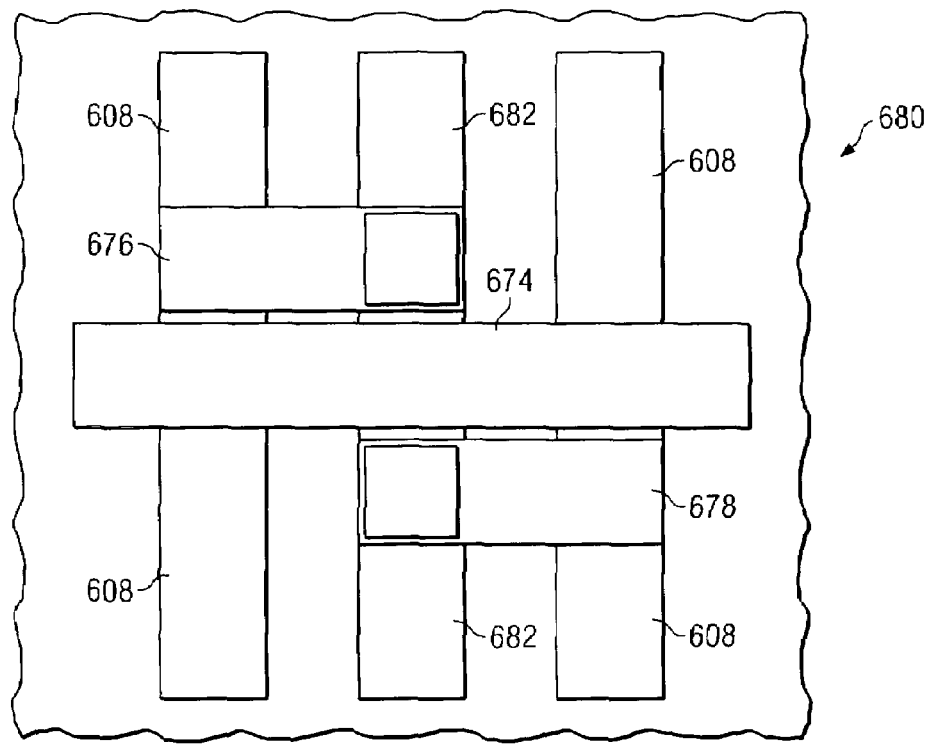

The novel deep trench isolation structures 216/316/416/516 and methods of formation described herein may be implemented in virtually any semiconductor device design requiring the use of deep trench isolation structures 216/316/416/516. As an example, FIGS. 11a, 11b, and 11c show cross-sectional views (FIG. 11a) and top views (FIGS. 11b and 11c) of the novel deep trench isolation structures 216/316/416/516 described herein implemented in a flash memory cell design. Referring first to FIG. 11a, the semiconductor device 600 includes a workpiece 602 having an N well 604 and a P well 606 formed therein. Source and drain region 608 is disposed over the P well 606. The flash memory cells include a floating gate 670, an inter-gate oxide 672, and a control gate electrode 674. Deep trench isolation structures 616 (e.g., comprising deep trench isolation structures 216/316/416/516 described herein) are formed between the flash memory cells to provide isolation. A shallow trench isolation structure 614 is formed at the top of each deep trench isolation structure 616. FIG. 11b shows a top view of the flash memory cell 680 after the front end of line (FEOL) manufacturing process for the structure, and FIG. 11c shows a top view of the flash memory cell 680 after the back end of line (BEOL), or metallization layer processing, for example. The metal runs 676 and 678 connect the drain 608 and source 608 to a contact layer 682 in the metallization structure, for example.

An example of implementing the novel embodiments of the present invention will next be described with reference to U.S. Pat. No. 6,909,139, issued on Jun. 21, 2005 to Shum et al., entitled, "One Transistor Flash Memory Cell," which is incorporated herein by reference. The novel deep trench isolation structures 216/316/416/416/616 described herein may be implemented in a one transistor flash memory cell designed described in U.S. Pat. No. 6,909,139, as shown in FIGS. 12 through 17. Note that other than reference number 700 which refers to a semiconductor device, and 216/316/416/516/616 which refer to a deep trench isolation structure in accordance with embodiments of the present invention, like numerals similar to drawings 1 through 11 are not used in FIGS. 12 through 17. Rather, the reference numbers used in U.S. Pat. No. 6,909,139 are used in FIGS. 12 through 17 for the majority of the elements, to be consistent with the description and figures of the issued U.S. Pat. No. 6,909,139 that is incorporated herein by reference.

Figure 12:
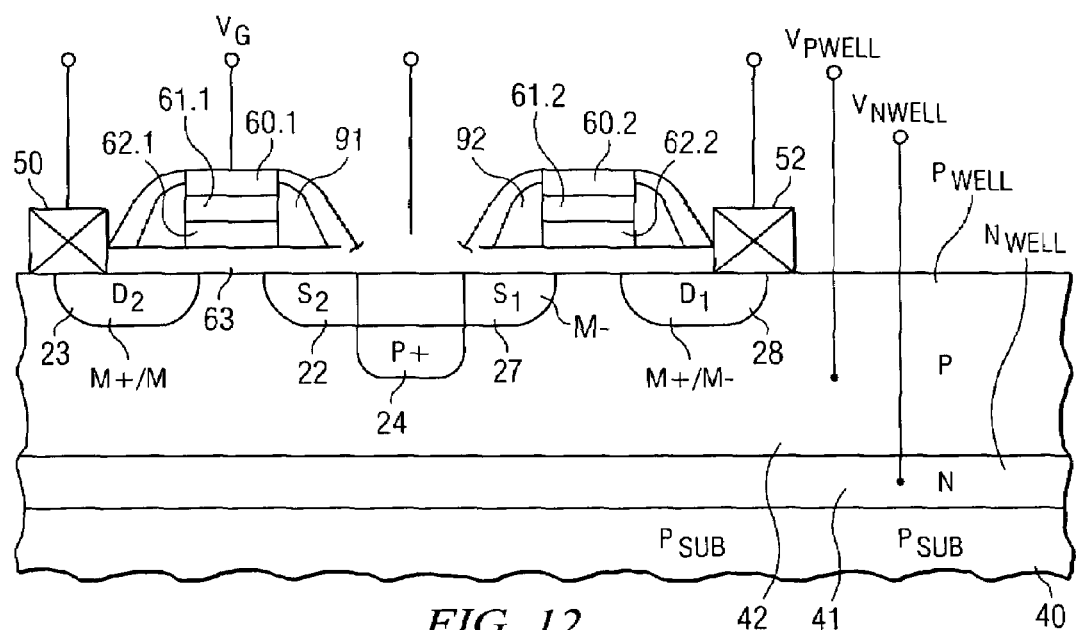
FIGS. 12 through 17 illustrate examples of implementing embodiments of the present invention in flash memory cell designs.

FIG. 12 of the present patent application corresponds to FIG. 5 of U.S. Pat. No. 6,909,139. FIG. 12 shows a typical floating gate structure that includes an insulating tunnel oxide layer 63 (typically thin SiO$_2$ or oxynitride) on the surface of the substrate 40 (e.g., comprising a workpiece such as workpiece 202 shown in FIG. 2 of the present patent application), a first conductive, charge storage layer on the insulating layer that forms the floating gate 62, an insulating layer 61 (typically an ONO layer) on the lower conductive layer, and a second conductive layer on the charge storage layer that forms the control gate 60. In response to a set of voltages applied to the control electrodes and to the wells, a charge may be stored or erased from the floating gate transistor, or the charging state will be sensed in the read mode.

Portions of the active areas between deep trenches are masked and self-aligned openings to spacers 91, 92 in order to form body tie regions. Source regions 22, 27, 32, 37 and others are formed by implanting the substrate with suitable N-type dopants and diffusing the dopants into the P-wells 42. The deep trenches prevent the sources from laterally spreading into adjacent columns. The sources are further masked and self-aligned to spacers 91, 92. A P-type implant is made into the opening between spacers 91, 92 to form P$^+$ body ties 24 in the source regions. Thus, each source is diffused via n$^-$/P$^+$ body tie to provide a continuous, buried bit line 14 in the common P-well 42. This buried bit line resistance is further reduced by subsequent silicide process prior to contact formation. Such silicidation must take place in the P$^+$ 24 overlap of the n⁻ region, extend to both ends of n⁻ region 22 and 27 but avoid extend to under the gate edge. Not every combined source region has a contact by a metal strap. It is sufficient to form contact with an upper level metal strap every thirty-two or sixty-four word lines (not shown) to reduce well resistance while maintaining single metal line per bit line simplicity. The added upper level of metal is simple to add, and does not adversely affect the footprint of the embedded memory array because its core processor already uses many levels of metals.

Figure 13:
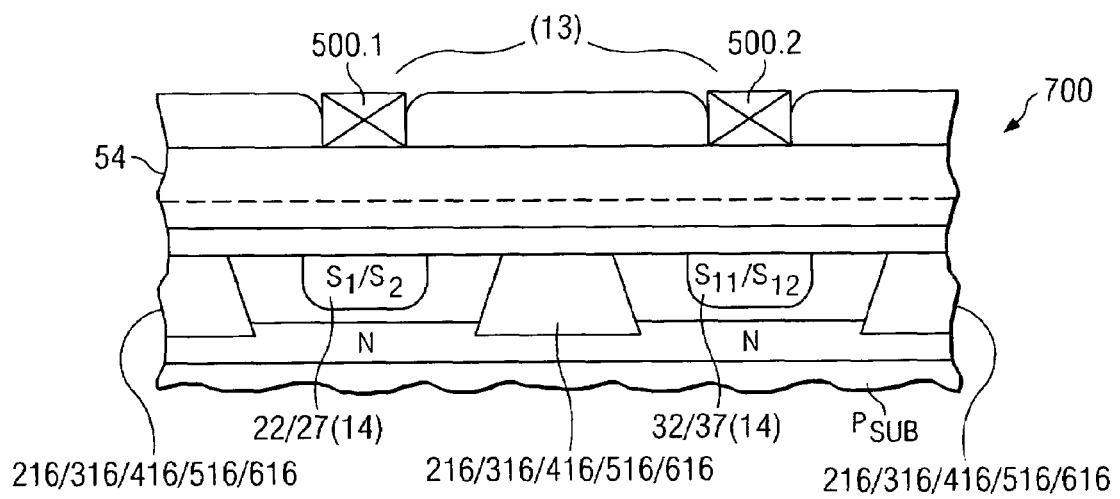

The transistors in a typical cell of the array are shown in FIG. 12, which again corresponds to FIG. 5 of U.S. Pat. No. 6,909,139. The substrate 40 has a deep N-well 41 and a shallow P-well 42. The transistors are in the P-well 42. From left to right, there is a drain region 23, a first floating gate stack (60.1, 61.1, 62.1), first and second sources 22, 27 with a P⁺ body tie 24, a second floating gate stack (60.2, 61.2, 62.2), and a second drain 28. Drain contacts 50, 52 extend above the substrate 40 to contact a raised metal bit line 500, as shown in FIG. 13. Source regions 22, 27 form buried bit lines 14 that are vertically aligned with the raised metal bit lines. A higher (upper level) metal line runs in parallel with and above drain bit line 500 and contacts the source buried bit lines 14. The sources, drains and control gates are silicided. Sidewall oxide and spacers isolate the gates from the drains and sources.

Figure 14:
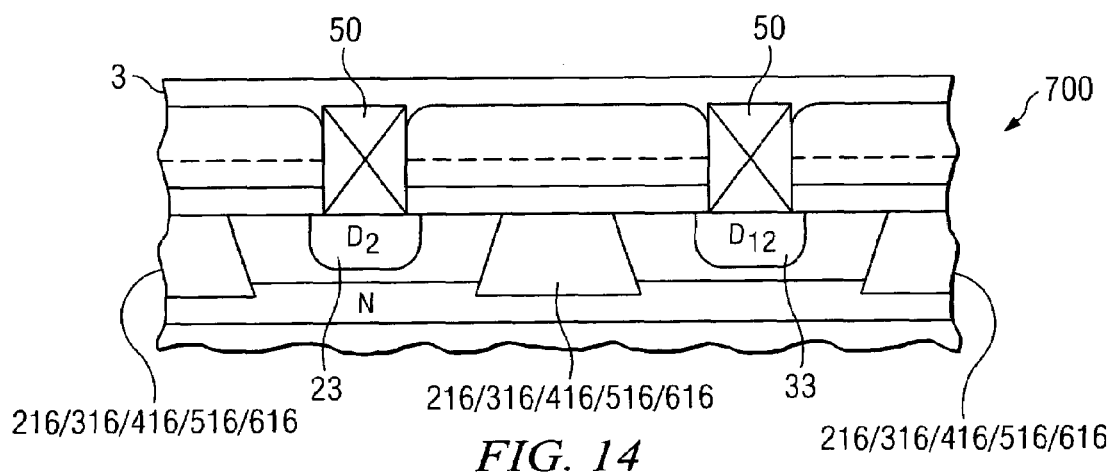

As shown in FIGS. 13 and 14, which correspond to FIGS. 7 and 8, respectively, of U.S. Pat. No. 6,909,139, the deep trenches isolation structures 216/316/416/516/616 separate adjacent columns and buried bit lines 14 from each other. Advantageously, the novel deep trenches 216/316/416/516/616 described herein provide improved lateral isolation of adjacent doped wells and improved isolation from substrates, by increasing the threshold voltage above which a deep trench isolation structure 216/316/416/516/616 begins to function as a parasitic transistor.

Figure 15:
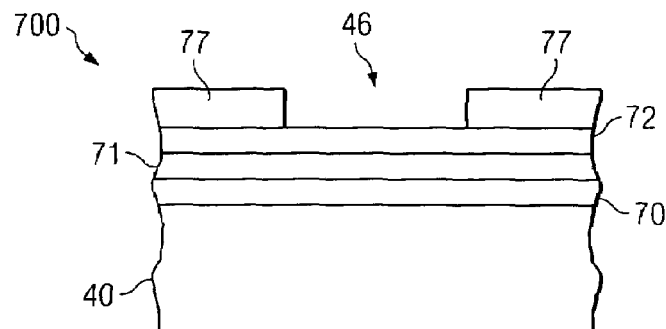
Figure 16:
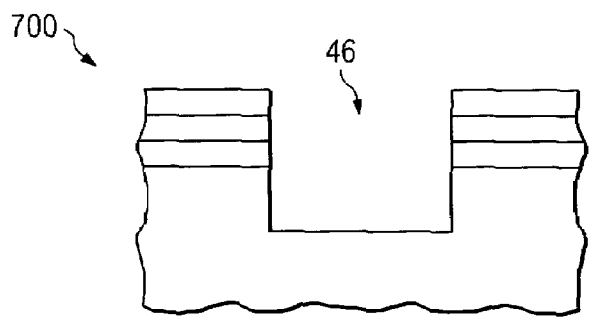

Referring next to FIGS. 15 and 16, which correspond to FIGS. 9 and 10, respectively, of U.S. Pat. No. 6,909,139, the steps involved in fabricating the deep trench 46 in which the deep trench isolation structures 216/316/416/516/616 of embodiments of the present invention are formed are shown. The deep trench 46 is formed and filled in accordance with embodiments of the present invention to form deep trench isolation structures 216/316/416/516/616 at the beginning of the process, generally before the shallow trench isolation that is used to separate the high voltage and CMOS devices is formed. This provides a modular approach for a System-on-Chip (SoC) device and avoids any unwarranted effects introduced by the addition of deep trench processes on the base logic process. The following process flow is just one embodiment for making devices with the invention, and those skilled in the art will understand that other process steps may be used to achieve equivalent process flow and equivalent devices. As such, the following example is for illustration purposes. The details such as film thickness, deposit temperature, additional films or integration can be varied.

In order to form the deep trench of the invention, a pad oxide layer 70 is deposited on the substrate 40, as shown in FIG. 15. The pad oxide is approximately 53 Angstroms thick. Next a pad nitride layer 71 with a thickness of about 1800 Angstroms is deposited over the pad oxide layer. A layer of boron-doped silicon glass (BSG) 72 is deposited on the pad nitride layer 71. The BSG 72 is patterned by a photoresist mask 77. The mask 77 provides openings 46 that will ultimately become the deep trench shown in FIG. 15. First, the BSG 72 is removed from the trench followed by resist strip and clean that leaves BSG on the active region as a hard mask to protect the substrate from the subsequent deep trench etch. Next is the main Si etch by removal of the nitride and pad oxide layers and then a portion of the substrate material 40 to provide the deep trench structure shown in FIG. 16. Part of the BSG 72 on the active region is removed during the deep trench etch. The remaining BSG over the active region is subsequently removed.

Then the trench is filled as described herein to form deep trench isolation structures 216/316/416/516/616, wherein a structure which causes the threshold voltage of the parasitic transistor to increase is formed in the deep trench isolation regions. Embodiments of the present invention are preferably implemented at the point in the manufacturing process for a flash memory cell shown in FIG. 16, after the formation of the trench. For example, after the isolation deep trench 46 is formed in the substrate 40, a channel stop region may be implanted into the bottom surface of the deep trench 40, a bottom portion of the deep trench 40 may be partially filled with an insulating material, or a doped polysilicon fill material may be disposed within the deep trench 40. Alternatively, combinations of these techniques may be used in order to increase the threshold voltage above which the deep trench isolation structure 216/316/416/516/616 begins to function as a parasitic transistor. The fabrication of the semiconductor device 700 is then continued to complete the device, for example.

Figure 17:
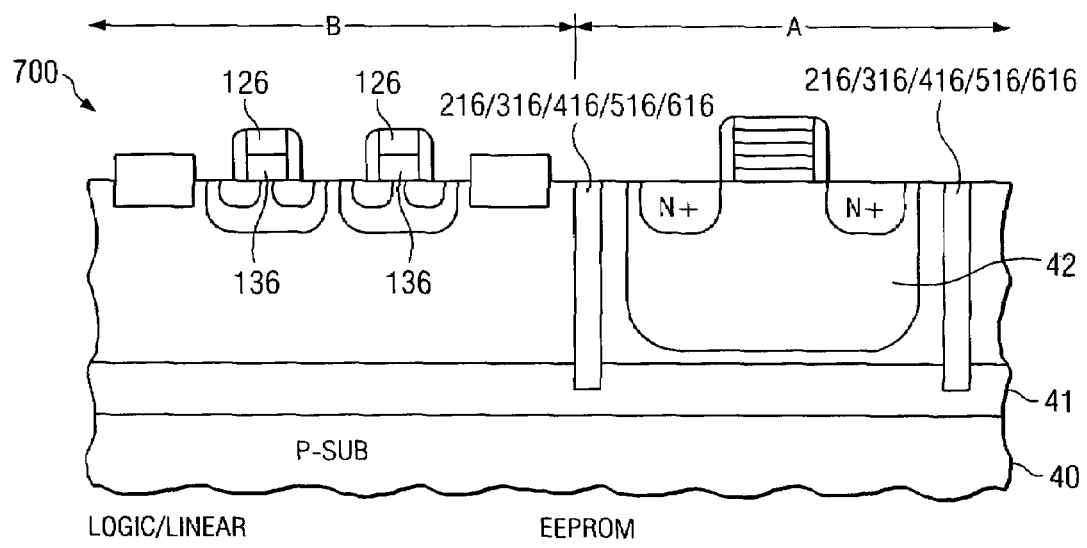

A more detailed view of an example of a completed flash memory cell structure 700 having the novel deep trench isolation structures 216/316/416/516/616 described herein, and in which embodiments of the present invention may be implemented, is shown in FIG. 17, which corresponds to FIG. 19 of U.S. Pat. No. 6,909,139. The methods of forming the structure shown in FIG. 17 may comprise the methods described with reference to FIG. 12 through 19 of U.S. Pat. No. 6,909,139. For example, the P-type substrate 40 is suitably patterned to form shallow trench isolation regions. The trench isolation regions isolate each pair of CMOS transistors and any linear or high voltage devices formed on the substrate. The deep trenches (e.g., for deep trench isolation regions 216/316/416/516/616) separate the memory columns from each other and from the other devices. Those skilled in the art understand that the invention may be made on an N-type substrate where the dopings are suitably reversed. The substrate 40 is then covered with a floating gate oxide followed by a layer of polysilicon. Prior to deposition of the layers, a suitable portion of the substrate, such as region A, is separately patterned and implanted to have a triple-well comprising N-well 41 that encloses P-well 42. A logic CMOS pair of transistors are in region B. The B regions may include transistors other than CMOS logic pairs. Those skilled in the art understand that transistor of one conductivity type may be formed in the B regions and the types of transistors may be logic or linear, including and not limited to power transistors such as LDMOS transistors.

The oxide and polysilicon layers are then patterned with photoresist to form a floating gate slit (parallel to the bit line). A layer of ONO interpoly dielectric is deposited over the substrate. The layer comprises sequentially a thermally grown bottom oxide, a deposited layer of low temperature deposited polysilicon that is re-oxidized to form top oxide at a later time. The layer is suitably patterned by photoresist to form two of the three layers of the ONO interpoly dielectric in the EEPROM stack. At this point, the layer and polysilicon layer are stripped from the peripheral regions B and they are suitably patterned and implanted to form P-wells 42 and N-wells 41.

The substrate 40 is covered with a layer of oxide followed by a second layer of polysilicon 126. The layer of oxide forms the gate oxide layer for the logic and linear devices and forms the upper oxide layer of the ONO dielectric layer. The polysilicon layer 126 is patterned and etched to form the control gates of the EEPROM transistors and the logic and linear transistors.

The description below creates a dual sidewall oxide that optimizes the reliability of a memory cell and maintains a shallow logic device S/D junction, similar to U.S. Pat. No. 6,841,824, which is incorporated herein by reference. A first TEOS layer is deposited over the second polysilicon layer. The first TEOS layer is then suitably patterned with photoresist to open the source and drain regions of the EEPROM. Source and drain regions are suitably implanted to form the source and drains of the EEPROM. After that, the first TEOS layer is removed by a highly selective reactive ion etching process, stopping on polysilicon layer 126. Then the sidewalls of the gate stack of the EEPROM are oxidized to provide a sidewall oxide suitable for flash stack transistors. The oxidation may take place at about 850 to 950° C. in a furnace for approximately 30 minutes in order to grow a sidewall that is about 15 manometers thick on the polysilicon regions of the gate stack, for example, although other oxidation parameters may also be used. Thereafter, a second TEOS layer is deposited over the substrate 40. TEOS layer is suitably patterned with a photoresist layer to form the gates and to open the source and drains of the logic and linear transistors, as shown in FIG. 17.

The sources and drains of the logic and/or linear transistors are implanted, the second TEOS layer is removed by reactive ion etching and the gates of the peripheral transistors receive a thinner sidewall oxide. The sidewall oxide is approximately 6 nanometers thick and may be generated by a relatively short rapid thermal annealing step, for example. The rapid thermal annealing (RTA) may be carried out at about 700 to 900° C. for about 10 to 20 seconds, although the RTA may also comprise other parameters. The RTA activates the doping in the logic and/or linear transistors but does not drive them very far into the substrate. This results in a logic and/or linear region with relatively closely spaced transistors.

Then the substrate is masked to expose only selected source regions in the memory array. The source regions are exposed and implanted with a P-type implant to form the P+ body ties, to the source N− junctions of the memory. Additional metal straps from upper levels of metal (e.g., metallization layer M3) will bring the source rail resistance down. Not every source region requires a metal strap, and every thirty-second or sixty-fourth source region is sufficient. There is no bit line pitch increase due to the addition of metal strap M3 since both the M1 bit line and M3 source lines run on top of each other.

The triple well allows the user to control the voltage on the deep buried N-well 41 and the shallow P-well 42 in order to program, erase, and read the array. A typical set of operating parameters for the flash memory cell to program, erase, and read appears in the following Table 1, where the voltages applied to the selected and unselected components are identified.

TABLE 1

|  | Read (volts) | Program (volts) | Erase (volts) |
| --- | --- | --- | --- |
| Selected cells: | | | |
| Gate | VPP = 2.5 | +14 | −14 |
| Drain | VDD = 1.25 | −3 | +3 |
| Source/P-well | 0 | −3 | +3 |
| Deep N-well | 0 | +3 | +3 |
| Unselected cells: | | | |

TABLE 1-continued

|  | Read (volts) | Program (volts) | Erase (volts) |
| --- | --- | --- | --- |
| Gate | 0 | 0/−3 | 0/+3 |
| Drain disturb | DR turn-on | | |
| Drain | 0 | +3 | +3 |
| Gate disturb | R. disturb | | |
| Source/P-well | 0 | +3 | +3 |
| Deep N-well | 0 | +3 | +3 |

For example, in operation, when the user desires to read the contents of a given flash transistor cell, the word line associated with the transistor is raised to approximately 2.5 volts. Likewise, the bit line connected to the drain is coupled to a voltage of approximately 1.25 volts. The output of the cell then appears on the other or source bit line. The deep N well is held at zero volts. The voltages for all of the other electrodes of the rest of the array are set to zero volts.

In order to program a transistor, the word line of the gate with the selected transistor is raised to +14 volts. The drain bit line is lowered to −3 volts, as is the buried source bit line, to provide a uniform voltage across the channel. The deep N well 41 is set to a positive voltage, such as +3 volts, as an example, to raise the body effect of the parasitic transistor and thus eliminate the parasitic leakage from the adjacent columns of cells. Setting the deep N well 41 to a positive voltage biases the N well 41, suppressing leakage current from the shallow P well 42 to the deep N well 41, for example. The gates of the unselected transistors are either set to zero or −3 volts and the other electrodes are set to +3 volts. In order to erase a program transistor, the drain and the source bit lines are set to +3 volts and the gate is set to −14 volts. The gates of the unselected transistors are set to between zero and +3 volts and all of the other electrodes are set to +3 volts.

Embodiments of the present invention may also be implemented in other applications where deep trenches are used to separate active areas from one another, for example.

Advantages of embodiments of the invention include increasing the threshold voltage above which a deep trench isolation structure 216/316/416/516/616 begins to function as a parasitic transistor, increasing device performance and improving the isolation capabilities of the deep trench isolation structure 216/316/416/516/616. Improved lateral isolation is provided by the novel deep trench isolation structures 216/316/416/516/616 described herein. The isolation structures 216/316/416/516/616 provide improved lateral isolation of adjacent doped wells and improved isolation from substrates. For example, the deep trenches may isolate two adjacent P wells embedded in a triple well, e.g., disposed above a buried N well, isolating the P wells and N well from the P doped substrate. This allows for different biases to be applied to the P wells, for example. The threshold voltage of parasitic transistors in the deep trench isolation structure 216/316/416/516/616 can be increased by about 5 to 10 V or greater, for example, by the use of embodiments of the present invention.

Advantageously, by inserting the deep trench isolation structures 216/316/416/516/616 between P wells, the adjacent P wells are isolated (e.g., P wells 506 in FIG. 10). Therefore, adjacent P wells may be biased independently, which may optimize performance in some applications, for example.

Furthermore, in embodiments where the semiconductive material used to fill the deep trench isolation structures 216/316/416/516/616 is doped, the doping may be achieved by an in-situ doping process in some embodiments, which is an advantage if the trenches for the deep trench isolation structures 216/316/416/516/616 are very deep and narrow, in which implantation of a dopant may be difficult, for example.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
a workpiece;
at least two devices formed within the workpiece;
at least one deep trench isolation structure including a top portion and a bottom portion formed within the workpiece between the at least two devices, a parasitic transistor being formed in the workpiece proximate the at least one deep trench isolation structure, the parasitic transistor having a threshold voltage;
a thin insulating liner lining the at least one deep trench isolation structure;
a semiconductive material filling at least the top portion of the at least one deep trench isolation structure within the thin insulating liner; and
a means for increasing the threshold voltage of the parasitic transistor.

2. The semiconductor device according to claim 1, wherein the at least one deep trench isolation structure comprises a bottom surface, wherein the means for increasing the threshold voltage of the parasitic transistor comprises a channel stop region formed within the bottom surface of the at least one deep trench isolation structure, wherein the workpiece comprises a first well comprising at least one first dopant and a second well comprising at least one second dopant disposed beneath the first well, wherein the at least one deep trench isolation structure extends into the first well and at least partially into the second well, wherein the channel stop region comprises the at least one second dopant or another dopant of the same type of the second dopant, wherein the second well comprises a first concentration of the at least one second dopant or of another dopant of the same type as the second dopant, and wherein the channel stop region comprises a second concentration of the at least one second dopant, the second concentration being greater than the first concentration.

3. The semiconductor device according to claim 1, wherein the means for increasing the threshold voltage of the parasitic transistor comprises an insulating material disposed within the bottom portion of the at least one deep trench isolation structure beneath the semiconductive material in the top portion of the at least one deep trench isolation structure.

4. The semiconductor device according to claim 3, wherein the workpiece comprises a first well comprising at least one first dopant and a second well comprising at least one second dopant disposed beneath the first well, wherein the at least one deep trench isolation structure extends into the first well and at least partially into the second well, wherein the insulating material comprises silicon dioxide and fills the at least one deep trench isolation structure within at least the second well.

5. The semiconductor device according to claim 3, wherein the insulating material comprises an oxide material, further comprising a nitride liner disposed over the thin insulating liner within the at least one deep trench isolation structure.

6. The semiconductor device according to claim 3, wherein the thin insulating liner comprises a first oxide liner, further comprising a second oxide liner disposed over the insulating material in the bottom portion of the at least one deep trench isolation structure and over at least the first oxide liner on sidewalls of the top portion of the at least one deep trench isolation structure.

7. The semiconductor device according to claim 1, wherein the means for increasing the threshold voltage of the parasitic transistor comprises a dopant implanted into or in-situ deposited together with the semiconductive material filling at least the top portion of the at least one deep trench isolation structure.

8. The semiconductor device according to claim 7, wherein the semiconductive material further fills the bottom portion of the at least one deep trench isolation structure.

9. The semiconductor device according to claim 7, wherein the workpiece comprises a first well comprising at least one first dopant and a second well comprising at least one second dopant disposed beneath the first well, wherein the at least one deep trench isolation structure extends into the first well and at least partially through the second well, wherein the dopant implanted into the semiconductive material comprises the at least one second dopant.

10. A semiconductor device, comprising:
a workpiece;
at least two devices formed within the workpiece;
at least one deep trench isolation structure including a top portion and a bottom portion formed within the workpiece between the at least two devices, the at least one deep trench isolation structure having a bottom surface and sidewalls;
a thin insulating liner lining the bottom surface and sidewalls of the at least one deep trench isolation structure;
a semiconductive material filling at least the top portion of the at least one deep trench isolation structure within the thin insulating liner; and
a channel stop region formed in the bottom surface of the at least one deep trench isolation structure, an insulating material disposed within the portion of a bottom of the at least one deep trench isolation structure beneath the semiconductive material, and/or a dopant implanted into or in-situ deposited together with the semiconductive material filling at least the top portion of the at least one deep trench isolation structure.

11. The semiconductor device according to claim 10, wherein the at least two devices comprise transistors or memory cells.

12. The semiconductor device according to claim 10, wherein the workpiece comprises a triple well, wherein the at least one deep trench isolation structure is formed within the triple well.

13. The semiconductor device according to claim 10, wherein the at least one deep trench isolation structure comprises a depth of about 3 μm or less within the workpiece.

14. The semiconductor device according to claim 10, further comprising a shallow trench isolation region formed at a top surface of the workpiece within the top portion of the at least one deep trench isolation structure.

15. A semiconductor device, comprising:
a workpiece;
a first flash memory cell and a second flash memory cell formed within the workpiece;
at least one deep trench isolation structure including a top portion and a bottom portion formed within the workpiece between the first flash memory cell and the second flash memory cell, a parasitic transistor being formed in the workpiece proximate the at least one deep trench isolation structure, the parasitic transistor having a threshold voltage;
a thin insulating liner lining the at least one deep trench isolation structure;
a semiconductive material filling at least the top portion of the at least one deep trench isolation structure within the thin insulating liner; and
a channel stop region formed in the bottom surface of the at least one deep trench isolation structure, an insulating material disposed within the portion of a bottom of the at least one deep trench isolation structure beneath the semiconductive material, and/or a dopant implanted into or in-situ deposited together with the semiconductive material filling at least the top portion of the at least one deep trench isolation structure, wherein the channel stop region, the insulating material, and/or the dopant of the semiconductive material increase the threshold voltage of the parasitic transistor, and wherein the first flash memory cell and the second flash memory cell each include a source region and a drain region formed within the top surface of the workpiece, a floating gate, and a control gate.

16. The semiconductor device according to claim 15, wherein the workpiece comprises a top surface, a first depth beneath the top surface, a second depth beneath the first depth, and a third depth beneath the second depth, wherein a first well is formed in the workpiece extending between the first depth and the second depth, the first well comprising at least one first dopant type, wherein a second well is formed in the workpiece and extends between the second depth and the third depth, the second well comprising at least one second dopant type, the at least one second dopant type being different than the at least one first dopant type, wherein a third well is formed in the workpiece beneath the second well, the third well comprising the at least one first dopant type, and wherein the at least one deep trench isolation structure extends from the top surface of the workpiece and at least into the second well.

17. The semiconductor device according to claim 15, wherein the thin insulating liner comprises about 40 nm or less of silicon dioxide.

18. The semiconductor device according to claim 15, wherein the semiconductive material comprises polysilicon.

19. The semiconductor device according to claim 15, wherein the workpiece includes two P wells disposed over an N well, wherein the N well is disposed over a p type substrate, and wherein the at least one deep trench isolation structure laterally isolates the two P wells from one another.

20. A semiconductor device, comprising:
two devices formed within a workpiece;
a trench isolation structure including a top portion and a bottom portion formed within the workpiece between the two devices, the trench isolation structure having a bottom surface and sidewalls, wherein the workpiece comprises a triple well and wherein the trench isolation structure is formed within the triple well;
a thin insulating liner lining the bottom surface and sidewalls of the trench isolation structure;
a semiconductive material filling at least the top portion of the trench isolation structure within the thin insulating liner; and
an insulating material filling the bottom portion of the trench isolation structure beneath the semiconductive material and within the thin insulating liner.

21. The semiconductor device according to claim 20, wherein the two devices comprise transistors or memory cells.

22. The semiconductor device according to claim 20, wherein the trench isolation structure comprises a depth of about 3 μm or less within the workpiece.

23. The semiconductor device according to claim 20, further comprising a shallow trench isolation region formed at a top surface of the workpiece within the top portion of the trench isolation structure.

24. The semiconductor device according to claim 20, wherein the bottom surface of the trench isolation structure comprises a channel stop region formed beneath the bottom surface of the trench isolation structure and within a well, the channel stop region comprising a first dopant which is different than a second dopant of the well.

25. A semiconductor device, comprising:
two devices formed within a workpiece;
a trench isolation structure including a top portion and a bottom portion formed within the workpiece between the two devices, the trench isolation structure having a bottom surface and sidewalls, wherein the bottom surface of the trench isolation structure comprises a channel stop region formed beneath the bottom surface of the trench isolation structure and within a well, the channel stop region comprising a first dopant which is different than a second dopant of the well;
a thin insulating liner lining the bottom surface and sidewalls of the trench isolation structure;
a semiconductive material filling at least the top portion of the trench isolation structure within the thin insulating liner; and
an insulating material filling the bottom portion of the trench isolation structure beneath the semiconductive material and within the thin insulating liner.

* * * * *